United States Patent [19]

Sittig et al.

[11] 4,142,201
[45] Feb. 27, 1979

[54] LIGHT-CONTROLLED THYRISTOR WITH ANODE-BASE SURFACE FIRING

[75] Inventors: Roland Sittig, Umiken; Patrick DeBruyne, Station Siggenthal, both of Switzerland

[73] Assignee: BBC Brown, Boveri & Company, Baden, Switzerland

[21] Appl. No.: 802,476

[22] Filed: Jun. 1, 1977

[30] Foreign Application Priority Data

Jun. 2, 1976 [CH] Switzerland ............ 6930/76
Apr. 15, 1977 [CH] Switzerland ............ 4680/77

[51] Int. Cl.² ............................................ H01L 29/74
[52] U.S. Cl. .............................. 357/38; 357/20; 357/30; 357/86
[58] Field of Search .................. 357/30, 38, 86, 20

[56] References Cited

U.S. PATENT DOCUMENTS

| | | | |
|---|---|---|---|
| 3,524,114 | 8/1970 | Hutson | 357/38 |
| 3,971,061 | 7/1976 | Matsushita et al. | 357/38 |
| 3,987,476 | 10/1976 | Sittig | 357/38 |
| 4,001,865 | 1/1977 | Voss | 357/38 |
| 4,003,072 | 1/1977 | Matsushita et al. | 357/38 |
| 4,060,826 | 11/1977 | Voss | 357/38 |

FOREIGN PATENT DOCUMENTS

| | | | |
|---|---|---|---|
| 2247006 | 5/1974 | Fed. Rep. of Germany | 357/38 |
| 2348254 | 8/1975 | Fed. Rep. of Germany | 357/38 |

OTHER PUBLICATIONS

H. Storm et al., "An Involute Gate–Emitter Configuration for Thyristors," IEEE Trans. on Elec. Dev., vol. ED-21 #8, Aug. 1974, pp. 520–522.

Webster's New Collegiate Dictionary, 2nd Edition, ©1960, G. & C. Merriam Co., Springfield, Mass. p. 855.

Primary Examiner—Joseph E. Clawson, Jr.
Attorney, Agent, or Firm—Oblon, Fisher, Spivak, McClelland & Maier

[57] ABSTRACT

A thyristor, with at least four zones of alternating opposite conductivity types, in which the first and fourth zones are contacted by the main electrodes and act as emitter zones, the second zone adjoins the first zone, and the third zone of lowest doping lies between the second and fourth zones. Both the second and the third zones together with the forward blocking PN-junction formed between them extend to the surface of the thyristor semiconductor chip on the side with the first zone. The portion of the forward blocking PN-junction reaching the surface can be irradiated with light so as to trigger the thyristor. There is provided in the surface a highly doped zone of the conductivity type of the first zone, which is connected with the second zone by an electrical contact on the surface. The part of the third zone extending to the surface encloses part of the second zone and the highly doped zone. The electrical contact connects the highly doped zone with the part of the second zone lying outside the region of the second zone enclosed by the third zone at the surface.

15 Claims, 5 Drawing Figures

1mm

LIGHT-CONTROLLED THYRISTOR WITH ANODE-BASE SURFACE FIRING

BACKGROUND OF THE INVENTION

1. Field of the Invention

The present invention relates generally to a thyristor which can be controlled by light and having at least four zones of alternating opposite conductivity types.

2. Description of the Prior Art

In the past, thyristors have been designed with at least four zones of alternating opposite conductivity types, in which the first and fourth zones are contacted by the main electrodes and act as emitter zones, the second zone adjoins the first, and the third, least-doped zone is located between the second and fourth zones. Both the second and the third zone, together with the forward-blocking PN-junction formed between them, extend to the surface of the thyristor semiconductor chip on the side with the first zone. The part of the forward-blocking PN-junction which emerges at the surface can be acted on by light for the purpose of triggering the thyristor. There is provided in the said surface a highly doped zone of the conductivity type of the first zone, the latter being connected with the second zone by an electrical contact on the surface.

Such a thyristor is known for instance from DT-OS No. 24 08 079. Although such thyristors have since been utilized with success, further optimization is possible.

SUMMARY OF THE INVENTION

Accordingly, an object of this invention is to provide an improved thyristor of the type mentioned, which is triggerable at still lower light intensities without adverse effect on other important properties, e.g., the resistance against being triggered by a fast voltage rise du/dt ("critical voltage steepness").

The objects of the present invention are achieved with a thyristor of the aforementioned type wherein the part of the third zone emerging at the surface encloses part of the second zone and the highly doped zone. Further, the electrical contact connects the highly doped zone with the part of the second zone lying outside the region of the second zone enclosed by the third zone at the surface.

In this way the current produced by the light irradiation is concentrated in one or a few regions, and there are obtained even at low light levels locally high current densities which can cause the triggering of the thyristor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
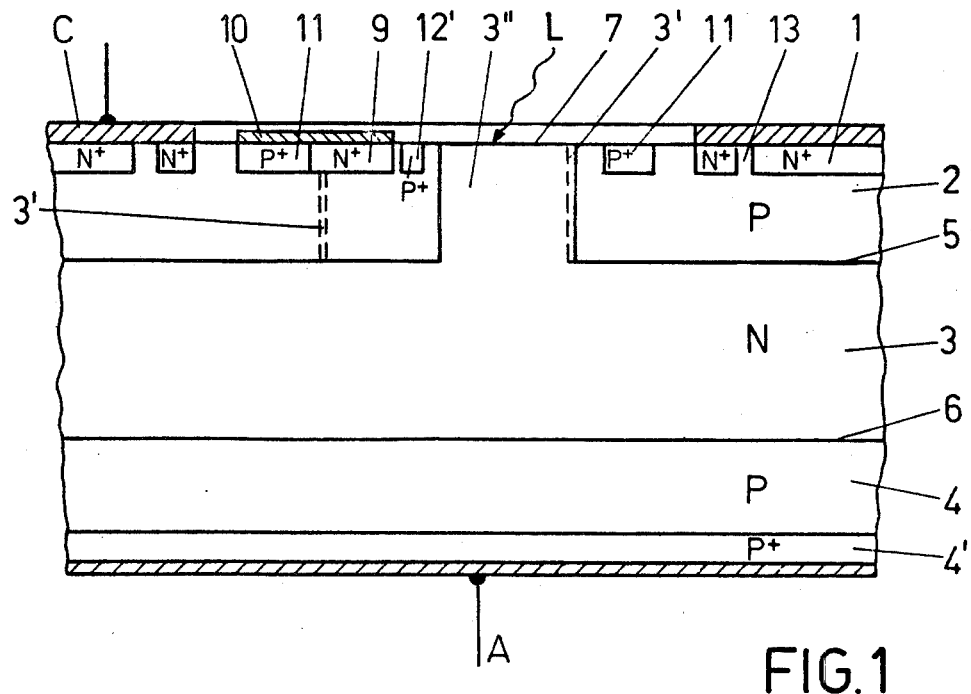
FIG. 1 is a section through a thyristor of the invention in which the highly doped zone of the conductivity type of the first zone lies in an opening of the part of the third zone reaching the surface.

Referring now to the drawings, wherein like reference numerals designate identical or corresponding parts throughout the several views, and more particularly to FIG. 1 thereof, the thyristor depicted has a first zone 1 which is heavily N-doped and thus acts as N-emitter zone. It is contacted by the cathode C. The second zone 2 is P-doped and would in a conventional thyristor triggered by way of a control electrode be contacted by the cathode. It contacts cathode C through emitter short circuits 13. The third, N-doped, zone 3 exhibits the lowest doping of all the zones and serves in particular for incorporation of the blocking layer, which in the forward direction forms at the forward blocking junction 5 and in the reverse direction at the reverse blocking junction 6. The fourth, P-doped zone 4 has on the outside a highly doped region 4' which is contacted by the anode A and acts as P-emitter zone.

In the surface 7 of the semiconductor chip of the thyristor is the highly N-doped zone 9 which, with the highly P-doped region 11, forms a $P^+N^+$- junction which is bridged over by the electrical contact 10. The zone 9 thus works in a known manner (cf. eg., Publication 671.15, 3/69 of the General Electric Co.) as the N-emitter of an auxiliary thyristor, which after being triggered furnishes the control current for triggering the main thyristor.

To this extent the structure of the thyristor corresponds to the state of the art.

In the present invention however, the part of the third zone 3 extending to the surface 7 of the thyristor semiconductor chip forms, on the one hand, a nearly closed curve 3' with an opening 8, and, on the other hand, parallel strips 3" situated inside the curve 3'. The $N^+$ doped zone 9 is located in the opening 8 and connects with a part of region 11 of zone 2 making a closed ring of highly P-doped material surrounding the curve 3', the $P^+N^+$-junction bridged over by the electrical contact 10.

By the described special structure of the N-zone 3 at the surface 7 the hole current produced by the light irradiation L at the surface portion of the PN-junction 5, made optimally long by the strip configuration, is caused to flow off at high concentration through the opening 8 to the cathode C. By way of zone 9 situated in the opening 8 and serving as emitter zone of the auxiliary thyristor, the hole current is caused to trigger the auxiliary thyristor which in turn triggers the main thyristor. The effect of the $P^+$-ring is to distribute the control current produced by the firing of the auxiliary thyristor immediately over the entire surroundings of main emitter zone 1 and thereby produce rapid firing of the thyristor over the entire cross section.

It is of great significance here that the easier triggering of the thyristor structure of the invention is not achieved at the expense of a decrease in the value of the critical voltage rise rate du/dt, which was to be feared on general principles. This is the result of the fact that the capacitance per unit area in a thyristor structure of the invention is, unexpectedly, distinctly smaller in the light-sensitive region than at the unexcited PN-junction, and in addition the du/dt sensitivity decreases at high forward blocking voltages. Only on this account does the local current density produced by the configuration of the invention not lead to a du/dt triggering.

Another particularly advantageous feature of the thyristor structure of the invention is that between the strips 3" on the surface 7 of the semiconductor chip there are corresponding P+ strips 12 which all join to a like-doped strip 12' lying crosswise to them between them and zone 9.

The P+ 12 corresponding to the N-strips 3" cause a lowering of the ohmic resistance for the hole current produced at the surface PN-junction 5 and conduct it to the crosswise P+ strip 12', which then—like a bus bar as it were—acts over the whole extent of the adjacent part of zone 9 of the auxiliary thyristor being triggered.

The curve 3' can, in principle, have more than one opening, each with a zone 9 situated in it, but a single opening is best on account of the consequent possibly very high hole concentration. A circular form for the curve 3' and the ring 11, and a central arrangement of this configuration in a circular hole in the cathode C is advantageous, since the thyristor can then be dimensioned more simply. The enlargement of the zone 9 inside the curve 3' and the corresponding long form and facing arrangement of the transverse N-strip 12' produce an especially strong interaction between these two parts.

The fabrication of a thyristor conforming to the invention is not difficult. For instance, in a first diffusion process into an N-doped silicon substrate of specific resistance 200 ohm-cm and thickness 800 $\mu$m, there are produced the zones 2 and 4 of, for example, 90 $\mu$m depth, during which process the regions of the strips 3" and the curve 3', the zone 9 and zone 1 are protected against in diffusion by a diffusion mask. Then, with continued masking of the mentioned regions plus the surface region of zone 2, the regions 11 and 4' are produced. Finally the N+ zones 1 and 9 are diffused with appropriate masking. The P+ regions 4' and 11 and the N+ zones 1 and 9 have a penetration depth of perhaps 15 $\mu$m. The width of the strips 3" may be 50 $\mu$m, the diameter of the circular curve 3', 3 mm, that of the ring 11, 4 mm, the width of the opening 8, 1 mm, the diameter of the circular hole in the emitter zone 1, 5.5 mm. The diameter of the entire thyristor is, for example, 14 mm. The emitter short circuits 13 may have an average separation of 1-2 mm and are distributed in a known manner over the entire cathode, C.

An element thus dimensioned blocks voltages of 4.5 KV, as an example, and at a 1KV forward blocking voltage can be triggered, for instance, by means of a CaAs light-emitting diode (950 nm) with a light level of 5 mW. The critical voltage rise rate du/dt at room temperature is better than 3000 V/$\mu$sec (measured in accordance with DIN 41 787).

The special advantages of a thyristor conforming to the invention, lie not only in the low light level required for triggering, but also in the fact that the quantum efficiency over a spectral band of about 540 nm–1000 nm is nearly 1 so that a variety of light sources can be used. The light level required for triggering is largely independent of the blocking voltage at which triggering occurs. A good du/dt strength is assured and, in addition, the thyristor is also protected in large measure against damage from overvoltages, or has a high "breakover strength," for the curvature of the forward blocking PN-junction 5 in the light-sensitive region produces there a reduction in the avalanche breakdown voltage so that overvoltages fire the thyristor from this region out over its whole volume and consequently no damage can occur.

Figure 2:
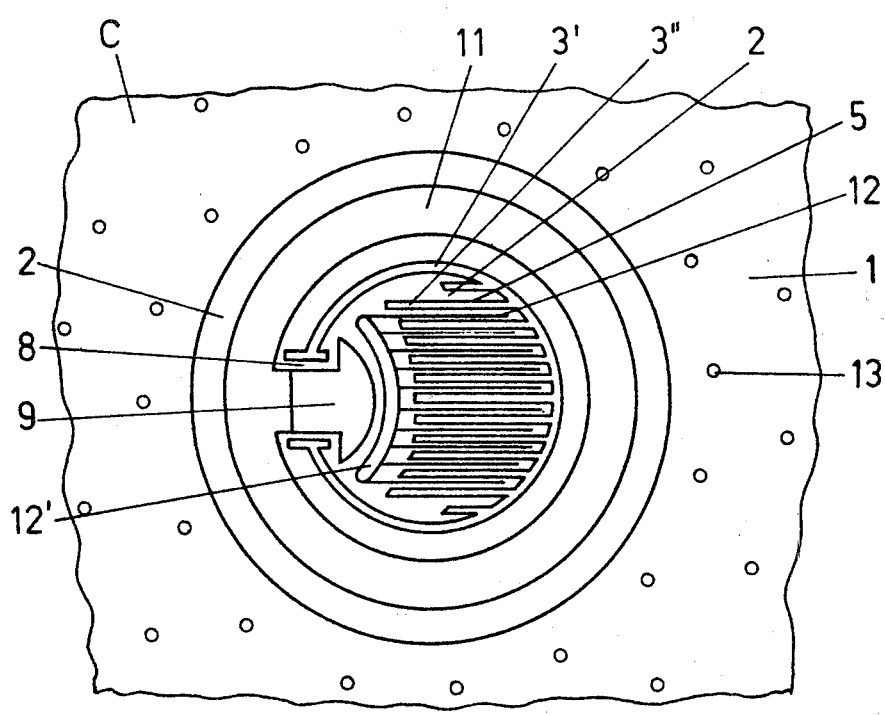
FIG. 2 is a top view of the thyristor of FIG. 1.
Figure 3:
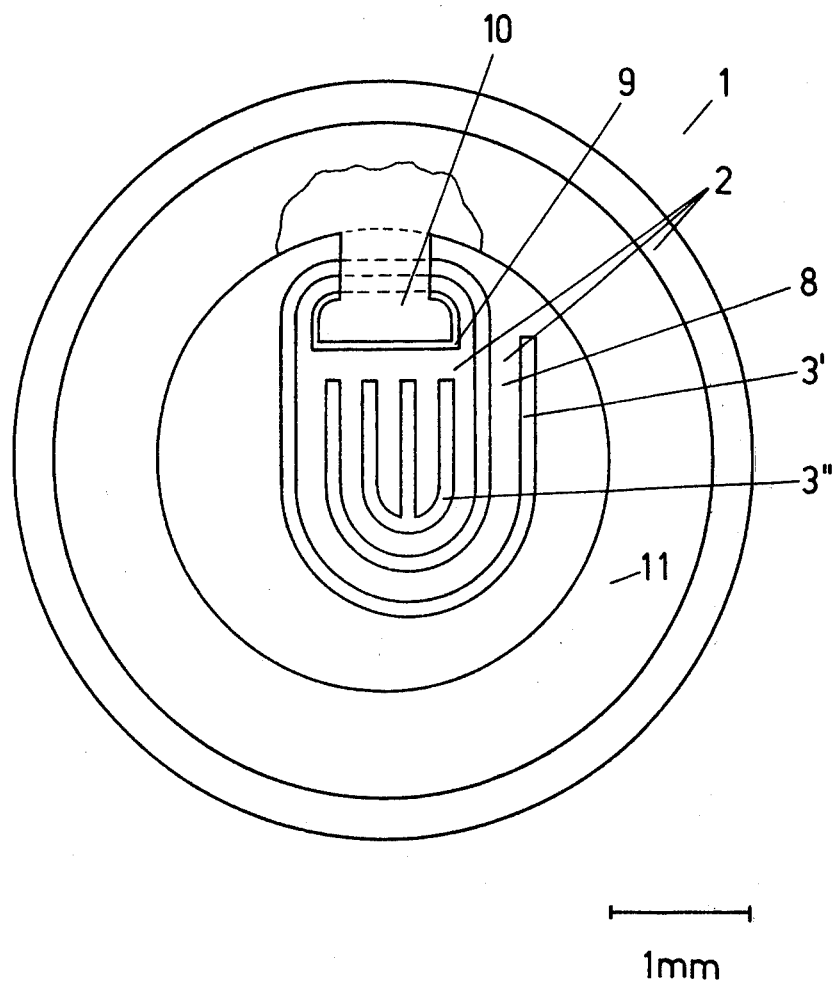
FIG. 3 is a top view of a thyristor in which the part of the third zone at the surface is in the form of a spiral curve.

The light-sensitive surface of another embodiment of the thyristor of the invention is drawn to scale in FIG. 3 (the scale of 1 mm is indicated at the lower right of the figure). In this thyristor the reference numbers correspond to those in the thyristor of FIGS. 1 and 2. It differs from the latter, however, in that the curve 3' is spiral in form and now has a long narrow channel as its opening, and in that the highly-doped zone 9 is now entirely contained in the region enclosed by the spiral curve 3'. In a thyristor structure such as this, the electrical contact 10 must be brought across the N-region 3' but be insulated from it. This insulation is preferably an approximately 1 $\mu$m thick oxide film, not shown. This film is oxidized onto the interior of the closed ring 11. Over the region of the N+-zone 9 which is to be contacted, a window is then etched in the oxide film. This film serves not only as insulation but simultaneously as passivating layer for the light-sensitive structure and in addition it reduces the light losses occasioned by reflection at the silicon surface.

This thyristor works as follows. If light in incident on the region enclosed by the spiral curve 3' then the hole current must flow to the cathode C through the relatively high resistance of the long narrow opening 8 (about 2K$\Omega$ by suitable dimensioning in FIG. 3 with a length of ~4 mm and a width of ~0.2 mm for the opening 8). Consequently the entire region of the P-doped zone 2 inside the curve 3' is raised to a higher potential relative to its surroundings. This holds particularly with respect to the N+ region 9 which, through the metallization 10, is at the potential of the P+ ring 11. At a potential difference of about 0.6 V the N+ region 9 injects electrons and the thyristor fires.

Such a thyristor very conveniently can be triggered at minimal light levels since the ohmic resistance between the regions 12 or 12' and 11 is greatly increased by choosing a very long and narrow opening 8 for curve 3'. This, of course, can be achieved in principle also by making the dimensions of the opening 8 of the thyristor in FIGS. 1 and 2 very small, but thereby the diffusion and metallization 10 of the N+ region 9 in such a narrow opening becomes extremely difficult. Along with a spiral form of the curve 3', any other form of curve 3' is also usable to advantage, if need be, in which there is a long narrow opening 8.

Figure 5:
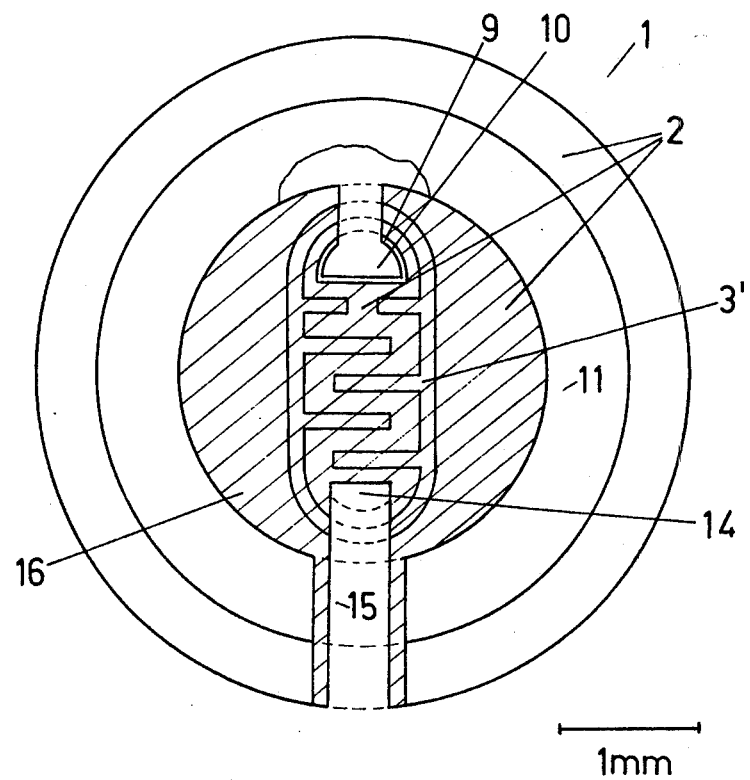
FIG. 5 is a top view of the thyristor of FIG. 4.
Figure 4:
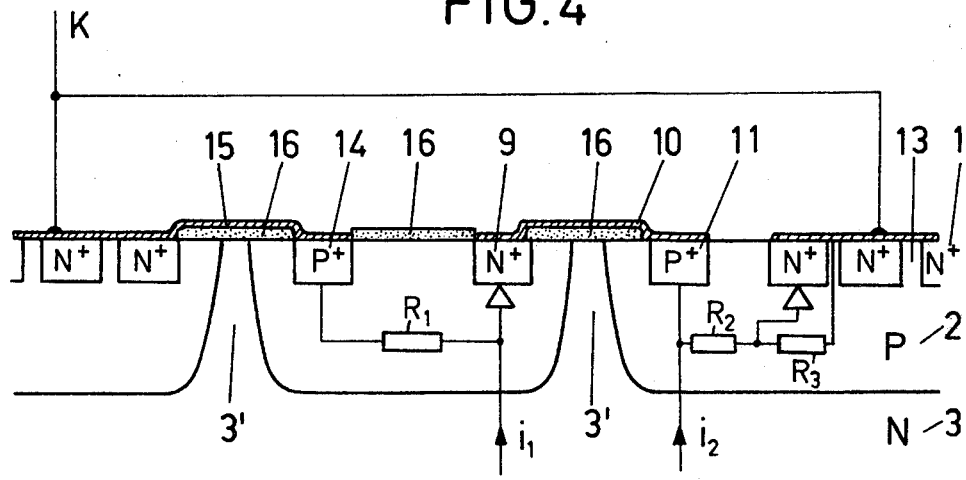
FIG. 4 is a section through a thyristor of the invention in which the part of the third zone at the surface is closed.

A third configuration of the thyristor of the invention is drawn to scale in FIGS. 4 and 5. Again the reference numbers are the same as those for the thyristors in FIGS. 1, 2 and 3. However, this thyristor differs from the others in that the part of the third zone extending to the surface forms a closed curve 3' which does not enclose the first zone, and in that this curve encircles the N+ doped zone 9 as well as a P+ doped zone 14. The P+ doped zone 14 is connected with the cathode metallization by the metallization 15. In such a thyristor structure the two metallizations 10 and 15 pass over the N$^-$ region 3', but are insulated from it. This insulation, as in the thyristor of FIG. 3, is preferably a ~1 $\mu$m thick oxidation film 16 which is oxidized onto the inside of region 11. Over the regions of the N+ and P+ zones 9 and 14 which are to be contacted, windows are then etched in the oxide film.

This thyristor works in the following way, as schematically indicated in FIG. 4. Incident light produces a current i, which flows to the cathode through the resistance R, corresponding to the opening 8 of the thyristors of FIG. 1 and 2 or 3. This current raises the potential of the entire region of the P-doped zone 2 lying inside the zone 3' with respect to its surroundings. This is especially true of the $N^+$ region 9 in the above embodiments, region 9 being tied by the metallization 10 to the potential of the $P^+$ region 11. At a potential difference of about 0.6 V the $N^+$ region 9 injects electrons.

A very special advantage of this thyristor is that with the choice of a very high triggering sensitivity, premature triggering by an all-surface current, as by the displacement current produced by a voltage rise rate du/dt or by its inverse current, is prevented. Such an all-surface current $i_2$ flows to the cathode through the series resistances $R_2$ and $R_3$ represented schematically in FIG. 4. In this way, however, the potential of the $P^+$ region 11 and the $N^+$ region 9 connected to it, is raised, so that with suitable dimensioning between the region 9 and the surrounding P-region of the second zone no potential difference is produced by the surface current $i_2$ and an injection with consequent premature and undesired triggering of the thyristor is avoided.

Suitable dimensioning is achieved on the one hand by making the area $F_1$ of the part of the second zone enclosed by the curve 3' as small as possible to compensate the all-surface current and on the other hand by increasing the resistance $R_1$ of this zone by forming a comb structure on the inner side of curve 3'. Beyond this, it is necessary to choose the ratio $F_2/F_1$ of the area $F_2$ of the second zone bounded by the inner edge of the cathode C and the curve 3' to the area $F_1$ of the part of the second zone enclosed by the curve 3' so that it equals the reciprocal ratio $R_1/(R_2 + R_3)$ of the resistances $R_2 + R_3$ and $R_1$ of the regions of the second zone with areas $F_2$ and $F_1$ ($F_2/F_1 = R_1/(R_2 + R_3)$). Thus every current from the area $F_1$ flows to the cathode C through the $P^+$ region 14 and the metallization 15. The highest potential arises in the P-region under the $N^+$ region 9. If a current from the area $F_2$ simultaneously flows to the cathode, then the potential of the $P^+$ region 11 and therefore of the metallization 10 and the $N^+$ region 9 also, is raised and injection of electrons is prevented.

Silber and Fullmann (International Electron Devices Meeting, 1975, Washington) have already proposed a compensating arrangement for preventing such undesired triggering in which the potential of the $N^+$ region of the auxiliary thyristor as well as that of the surrounding P region is raised. In this arrangement, however, the areas $F_1$ and $F_2$ are not adjacent, rather a connection to the outer edge of the thyristor is required.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A light-controlled thyristor comprising:
   a pair of main electrodes comprising a cathode electrode and an anode electrode;
   a semiconductor chip having at least four zones of alternating opposite conductivity types, the first zone contacted by said cathode electrode and the fourth zone contacted by said anode electrode, the first and fourth zones acting as emitter zones, the second zone adjoining the first zone, and the third zone of lowest doping lying between the second and fourth zones, a forward blocking PN-junction being formed between the second and third zones, both the second and the third zones together with the forward blocking PN-junction formed between them extending to a surface of the semiconductor chip on the side with the first zone, and current concentration means comprising at least a part of said third zone extending to the surface forming a curve, said curve at least substantially circumscribing a part of said second zone extending to said surface, the thyristor triggering when the portion of the forward blocking PN-junction reaching the surface is irradiated with light;
   a highly doped zone of the conductivity type of the first zone provided in the surface of the semiconductor chip, the part of the third zone extending to the surface at least partially circumscribing a part of the highly doped zone whereby irradiation of said forward blocking PN-junction produces a current in said second zone, which current is concentrated by said curve toward said highly doped zone; and,
   an electrical contact connecting the highly doped zone with the second zone outside the part of the second zone surrounded by the third zone at the surface.

2. The thyristor recited in claim 1, wherein the part of the third zone extending to the surface and forming said curve defines at least one opening and does not enclose the first zone, and the highly doped zone is located in the opening.

3. The thyristor recited in claim 2, wherein the part of the third zone extending to the surface forms parallel strips lying inside the curve.

4. The thyristor recited in claim 3, including between the strips at the surface of the thyristor semiconductor chip corresponding strips of the conductivity type of the second zone but with a higher doping concentration, all of which connect with a similarly doped strip transverse to the strips and lying between these and the highly doped zone.

5. The thyristor recited in claim 4, wherein the curve at the surface of the semiconductor chip is surrounded by a closed ring of the conductivity type of the second zone, but with higher doping concentration than the second zone, the ring being connected to the highly doped zone by the electrical contact on the surface.

6. The thyristor recited in claim 5, wherein the curve is made circular and has only one opening in which is located the highly doped zone which enlarges inside the curve and faces there the transverse strip, and the closed ring is also made circular and the closed ring lies centrally on the surface of the thyristor semiconductor chip in a circular hole in the main electrode contacting the first zone.

7. The thyristor recited in claim 2, wherein the curve has a spiral shape and has a long narrow channel as the opening, and that the highly doped zone is wholly contained in the region enclosed by the spiral curve.

8. The thyristor recited in claim 1, wherein the part of the third zone extending to the surface of the semiconductor chip forms a closed curve, a part of the first zone lying outside of the closed curve.

9. The thyristor recited in claim 8 wherein the curve surrounds the highly doped zone of the conductivity type of the first zone, a highly doped zone of the conductivity type of the second zone and a portion of the second zone.

10. The thyristor recited in claim 9 wherein the ratio of the area of the second zone bounded by the inner edge of the cathode electrode and the curve to the area of the part of the second zone inside the curve, is equal to the reciprocal ratio of the resistances of the regions of the second zone defined by these areas.

11. The thyristor recited in claim 8 wherein the curve is provided with comb structures on its inner side.

12. The thyristor recited in claim 1 wherein the surface of the semiconductor chip in the region of the part of the third zone extending to the surface and the area enclosed by the latter are provided with an oxide film having a window in it for the highly doped zone of the conductivity type of the first zone.

13. The thyristor recited in claim 5 wherein the surface of the semicondutor chip in the region of the part of the third zone extending to the surface and the area enclosed by the latter are provided with an oxide film having a window in it for the highly doped zone of the conductivity type of the first zone and the oxide film is inside the ring of the conductivity type of the second zone.

14. The thyristor as in claim 9 wherein the surface of the semiconductor chip in the region of the part of the third zone extending to the surface and the area enclosed by the latter are provided with an oxide film having a window in it for the highly doped zone of the conductivity type of the first zone and the oxide film includes a window over the highly doped zone of the conductivity type of the second zone.

15. The thyristor recited in claim 9 including a metallization between the highly doped zone and the cathode electrode.

* * * * *